United States Patent
Bi et al.

(10) Patent No.: US 12,153,750 B2
(45) Date of Patent: Nov. 26, 2024

(54) DISPLAY APPARATUS

(71) Applicants: Chengdu BOE Optoelectronics Technology Co., Ltd., Sichuan (CN); BOE Technology Group Co., Ltd., Beijing (CN)

(72) Inventors: Danyang Bi, Beijing (CN); Xiaoxia Liu, Beijing (CN); Hongjin Hu, Beijing (CN); Wei Chen, Beijing (CN); Xiaoliang Fu, Beijing (CN); Xiaodong Hao, Beijing (CN); Xiangdong Wei, Beijing (CN)

(73) Assignees: Beijing BOE Technology Development Co., Ltd., Beijing (CN); Chengdu BOE Optoelectronics Technology Co., Ltd., Sichuan (CN)

( * ) Notice: Subject to any disclaimer, the term of this patent is extended or adjusted under 35 U.S.C. 154(b) by 0 days.

(21) Appl. No.: 18/041,076

(22) PCT Filed: May 20, 2022

(86) PCT No.: PCT/CN2022/094193
§ 371 (c)(1),
(2) Date: Feb. 8, 2023

(87) PCT Pub. No.: WO2023/221112
PCT Pub. Date: Nov. 23, 2023

(65) Prior Publication Data
US 2024/0264686 A1 Aug. 8, 2024

(51) Int. Cl.
*G06F 3/041* (2006.01)
*H05K 1/11* (2006.01)

(52) U.S. Cl.
CPC .......... *G06F 3/0412* (2013.01); *H05K 1/118* (2013.01); *H05K 2201/094* (2013.01); *H05K 2201/09409* (2013.01); *H05K 2201/09709* (2013.01)

(58) Field of Classification Search
CPC G06F 3/0412; H05K 1/118; H05K 2201/094; H05K 2201/09409; H05K 2201/09709
See application file for complete search history.

(56) References Cited

U.S. PATENT DOCUMENTS 9,846,455 B2  12/2017  Kim
10,551,697 B2  2/2020  Ueno
(Continued)

FOREIGN PATENT DOCUMENTS

CN  100466388 C  3/2009
CN  105101675 A  11/2015
(Continued)

OTHER PUBLICATIONS

International Search Report & Written Opinion mailed Dec. 21, 2022, regarding PCT/CN2022/094193.

*Primary Examiner* — Michael Pervan
(74) *Attorney, Agent, or Firm* — Intellectual Valley Law, P.C.

(57) ABSTRACT

A display apparatus is provided. The display apparatus includes a display panel; a main printed circuit configured to be electrically connected to an array of subpixels in the display panel; a touch control structure on the display panel; and a touch printed circuit configured to be electrically connected to touch electrodes in the touch control structure. The display apparatus includes a slot defining a cavity configured to receive at least a first portion of the touch printed circuit. A thickness of the touch printed circuit is less than or equal to a depth of the slot.

20 Claims, 14 Drawing Sheets

(56) References Cited

U.S. PATENT DOCUMENTS

| | | |
|---|---|---|
| 2006/0160410 A1 | 7/2006 | Idenishi |
| 2020/0026391 A1 | 1/2020 | Tomokawa |
| 2020/0236213 A1 | 7/2020 | He |

FOREIGN PATENT DOCUMENTS

| | | |
|---|---|---|
| CN | 107809843 B | 3/2018 |
| CN | 110035602 A | 7/2019 |
| CN | 110737369 A | 1/2020 |
| CN | 111508356 A | 8/2020 |
| KR | 20140116990 A | 10/2014 |
| KR | 101950833 B1 | 2/2019 |
| WO | 2019071671 A1 | 4/2019 |

DISPLAY APPARATUS

CROSS-REFERENCE TO RELATED APPLICATION

This application is a national stage application under 35 U.S.C. § 371 of International Application No. PCT/CN2022/094193, filed May 20, 2022, the contents of which are incorporated by reference in the entirety.

TECHNICAL FIELD

The present invention relates to display technology, more particularly, to a display apparatus having a touch printed circuit.

BACKGROUND

Various types of touch panels have been developed. Examples of touch panels include one-glass-solution (OGS) touch panels, on-cell touch panels, and in-cell touch panels. A touch control structure may also simply be added onto a display module. In an add-on touch panel, a touch printed circuit in addition to a display driving printed circuit is required.

SUMMARY

In one aspect, the present disclosure provides a display apparatus, comprising a display panel; a main printed circuit configured to be electrically connected to an array of subpixels in the display panel; a touch control structure on the display panel; and a touch printed circuit configured to be electrically connected to touch electrodes in the touch control structure; wherein the display apparatus comprises a slot extending defining a cavity configured to receive at least a first portion of the touch printed circuit; and a thickness of the touch printed circuit is less than or equal to a depth of the slot.

Optionally, the display apparatus further comprises a support layer between the main printed circuit and the display panel; wherein the slot is configured to extend through the main printed circuit, exposing a surface of a portion of the support layer; and the first portion of the touch printed circuit is secured onto the surface of the portion of the support layer.

Optionally, the main printed circuit comprises a plurality of first bonding pads in a bonding area outside a region having the slot; the touch printed circuit comprises a connector comprising a plurality of second bonding pads configured to be respectively connected to the plurality of first bonding pads; the plurality of second bonding pads comprise multiple non-truncated bonding pads and one or more truncated bonding pads in a same row; and a respective truncated bonding pad is truncated at an end as compared to a respective non-truncated bonding pad in the same row.

Optionally, the one or more truncated bonding pads are configured to be bonded to one or more first bonding pads in a peripheral region of the bonding area.

Optionally, the plurality of second bonding pads comprise at least a first row of bonding pads and a second row of bonding pads; the multiple non-truncated bonding pads and the one or more truncated bonding pads are in the second row; and the one or more truncated bonding pads are outermost bonding pads on one side of the second row.

Optionally, tips of bonding pads in the second row are substantially aligned along a straight virtual line; a tip of the respective non-truncated bonding pad is connected to a pad body of the respective non-truncated bonding pad; and a tip of the respective truncated bonding pad is disconnected from a pad body of the respective truncated bonding pad.

Optionally, the respective truncated bonding pad and the respective non-truncated bonding pad have a substantially same shape except for disconnection between a tip and a pad body of the respective truncated bonding pad whereas a tip and a pad body of the respective non-truncated bonding pad are connected.

Optionally, the respective non-truncated bonding pad comprises a first substantially hexagonal pad body and a first substantially rectangular tip connected to the first substantially hexagonal pad body, the first substantially rectangular tip being narrower than the first substantially hexagonal pad body; and the respective truncated bonding pad comprises a second substantially hexagonal pad body.

Optionally, the respective truncated bonding pad further comprises a second substantially rectangular tip disconnected from the second substantially hexagonal pad body, the second substantially rectangular tip being narrower than the second substantially hexagonal pad body; and a first length of the first substantially rectangular tip along a direction from the first substantially hexagonal pad body to the first substantially rectangular tip is greater than a second length of the second substantially rectangular tip along a direction from the second substantially hexagonal pad body to the second substantially rectangular tip.

Optionally, the touch printed circuit comprises the first portion, a second portion, and a third portion spacing apart the first portion and the second portion; the first portion and the second portion are respectively coated with an adhesive; and the third portion is substantially free of the adhesive.

Optionally, the display apparatus further comprises a support layer between the main printed circuit and the display panel; wherein the slot is configured to expose a surface of a portion of the support layer; the first portion of the touch printed circuit is secured onto the surface of the portion of the support layer; the second portion of the touch printed circuit is secured onto a surface of a portion of the main printed circuit; and the third portion of the touch printed circuit is detached from the support layer and detached from the main printed circuit.

Optionally, the touch printed circuit comprises a connector comprising a plurality of second bonding pads; and a fourth portion spacing apart the first portion and the connector; wherein the first portion is coated with an adhesive, and secured onto a surface of a portion of the main printed circuit; the plurality of second bonding pads of the connector are respectively connected to a plurality of first bonding pads in a bonding area of the main printed circuit; and the fourth portion is detached from the support layer and detached from the main printed circuit.

Optionally, the touch printed circuit comprises a second portion and a circuit bending portion; the circuit bending portion is bent to connect the second portion to the touch control structure, forming a first bending cavity; the touch control structure is on a light emitting side of the display panel; and the second portion is on a back side of the display panel, the back side being opposite to the light emitting side.

Optionally, the touch printed circuit comprises a circuit bending portion, a second portion, a third portion, the first portion, a fourth portion, and a connector consecutively arranged; the display apparatus further comprises a support layer between the main printed circuit and the display panel; the slot is configured to expose a surface of a portion of the support layer; the first portion of the touch printed circuit is secured onto the surface of the portion of the support layer; the second portion is secured onto a surface of a portion of the main printed circuit; the third portion is detached from the support layer and detached from the main printed circuit; the fourth portion is detached from the support layer and detached from the main printed circuit; the connector comprising a plurality of second bonding pads respectively connected to a plurality of first bonding pads in a bonding area of the main printed circuit; and the circuit bending portion is bent to connect the second portion to the touch control structure, forming a first bending cavity.

Optionally, the display panel comprises a front portion configured to display an image, a panel bending portion, and a back portion consecutively arranged; and the panel bending portion is bent to connect the front portion to the back portion, forming a second bending cavity.

Optionally, the display apparatus further comprises a support layer between the main printed circuit and the display panel; wherein the touch printed circuit comprises a second portion and a circuit bending portion; the circuit bending portion is bent to connect the second portion to the touch control structure, forming a first bending cavity; the circuit bending portion is configured to bend around a first portion of a periphery of the support layer; and the panel bending portion is configured to bend around a second portion of the periphery of the support layer.

Optionally, the first portion and the second portion are non-overlapping.

Optionally, the first portion and the second portion are at least partially overlapping.

Optionally, the display panel comprises a front portion configured to display an image; the touch control structure is on a light emitting side of the front portion; the touch printed circuit comprises a reminder portion on a back side of the front portion and a circuit bending portion bent to connect the reminder portion to the touch control structure, the back side being opposite to the light emitting side; and the main printed circuit and the touch printed circuit are on the back side of the front portion, the touch printed circuit being on a side of the main printed circuit away from the display panel; wherein the display apparatus further comprises a support layer between the main printed circuit and the front portion, and on the back side of the front portion; and a first optical clear adhesive layer between the front portion and the touch control structure, adhering the touch control structure onto the front portion.

Optionally, the display apparatus further comprises a polarizer on the light emitting side of the front portion, and on a side of the touch control structure away from the first optical clear adhesive layer; a second optical clear adhesive layer on a side of the polarizer away from the touch control structure; and a cover window on a side of the second optical clear adhesive layer away from the polarizer.

Optionally, the cavity is configured to generally conformed to external geometry of the first portion of the touch printed circuit.

Optionally, the slot has a substantially U shape; and the first portion of the touch printed circuit has a substantially U shape.

Optionally, the support layer comprises a heat dissipation material.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

The present disclosure provides, inter alia, a touch substrate, a display apparatus that substantially obviate one or more of the problems due to limitations and disadvantages of the related art. In one aspect, the present disclosure provides a display apparatus. In some embodiments, the display apparatus includes a display panel; a main printed circuit configured to be electrically connected to an array of subpixels in the display panel; a touch control structure on the display panel; and a touch printed circuit configured to be electrically connected to touch electrodes in the touch control structure. The display apparatus includes a slot defining a cavity configured to receive at least a first portion of the touch printed circuit. A thickness of the touch printed circuit is less than or equal to a depth of the slot.

Figure 1:
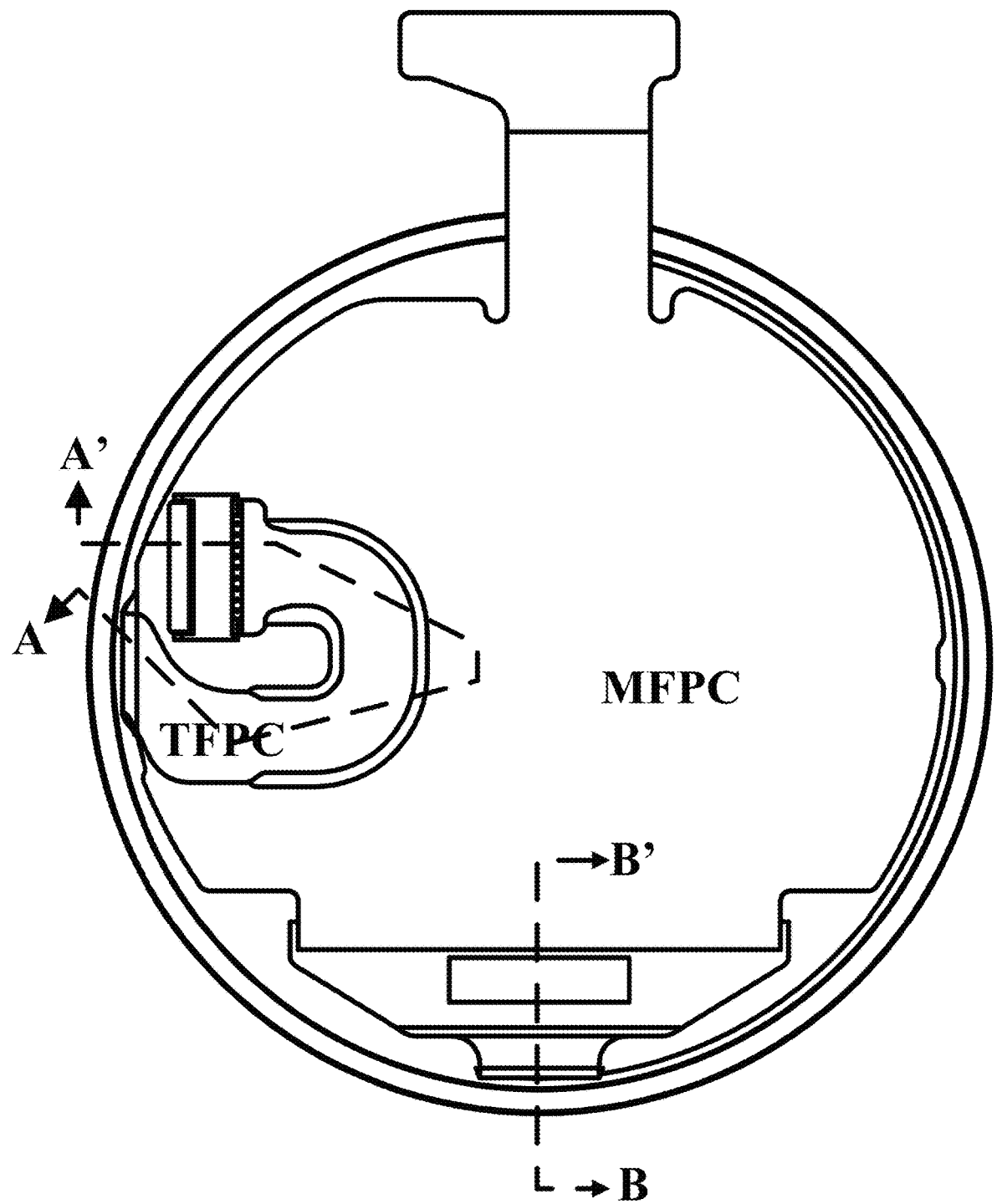
FIG. 1 is a plan view of a back side of a display apparatus in some embodiments according to the present disclosure.
Figure 2:
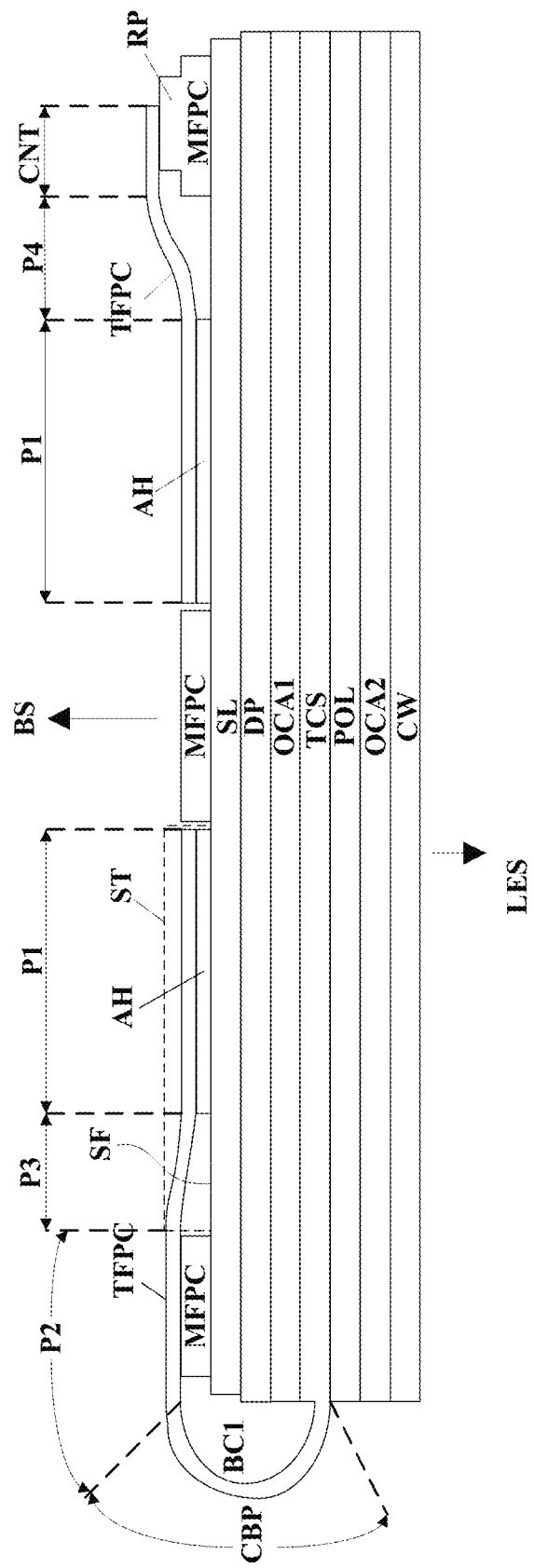
FIG. 2 is a cross-sectional view along an A-A' line in FIG. 1.
Figure 3:
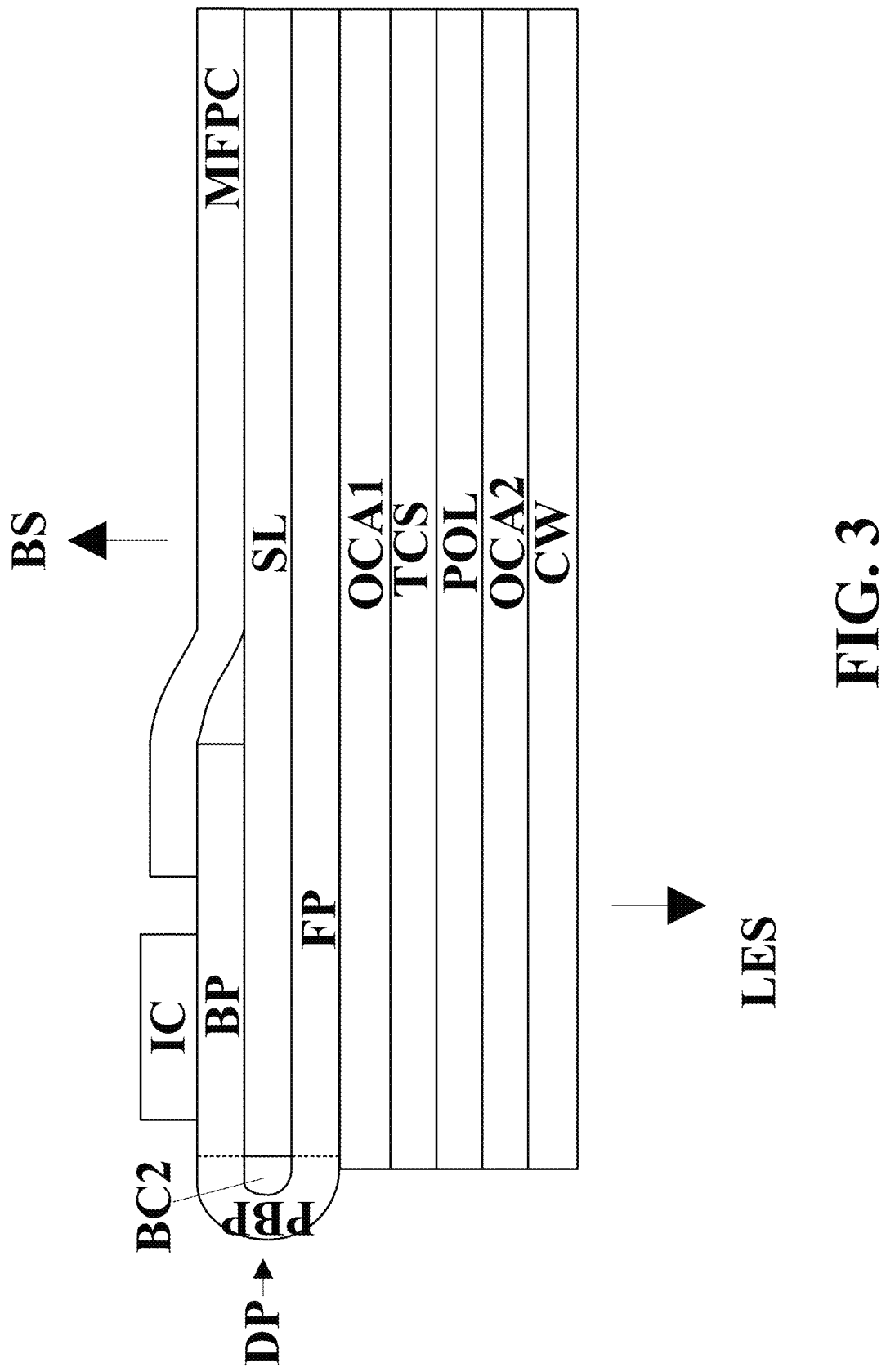
FIG. 3 is a cross-sectional view along a B-B' line in FIG. 1.

FIG. 1 is a plan view of a back side of a display apparatus in some embodiments according to the present disclosure. FIG. 2 is a cross-sectional view along an A-A' line in FIG. 1. FIG. 3 is a cross-sectional view along a B-B' line in FIG. 1. Referring to FIG. 1 to FIG. 3, the display apparatus in some embodiments includes a display panel DP, a main printed circuit MFPC configured to be electrically connected to an array of subpixels in the display panel DP, a touch control structure TCS on the display panel DP, and a touch printed circuit TFPC configured to be electrically connected to touch electrodes in the touch control structure TCS. As discussed in the present disclosure, the present display apparatus can be made ultra-thin, while avoiding various potential touch function defects.

Figure 4:
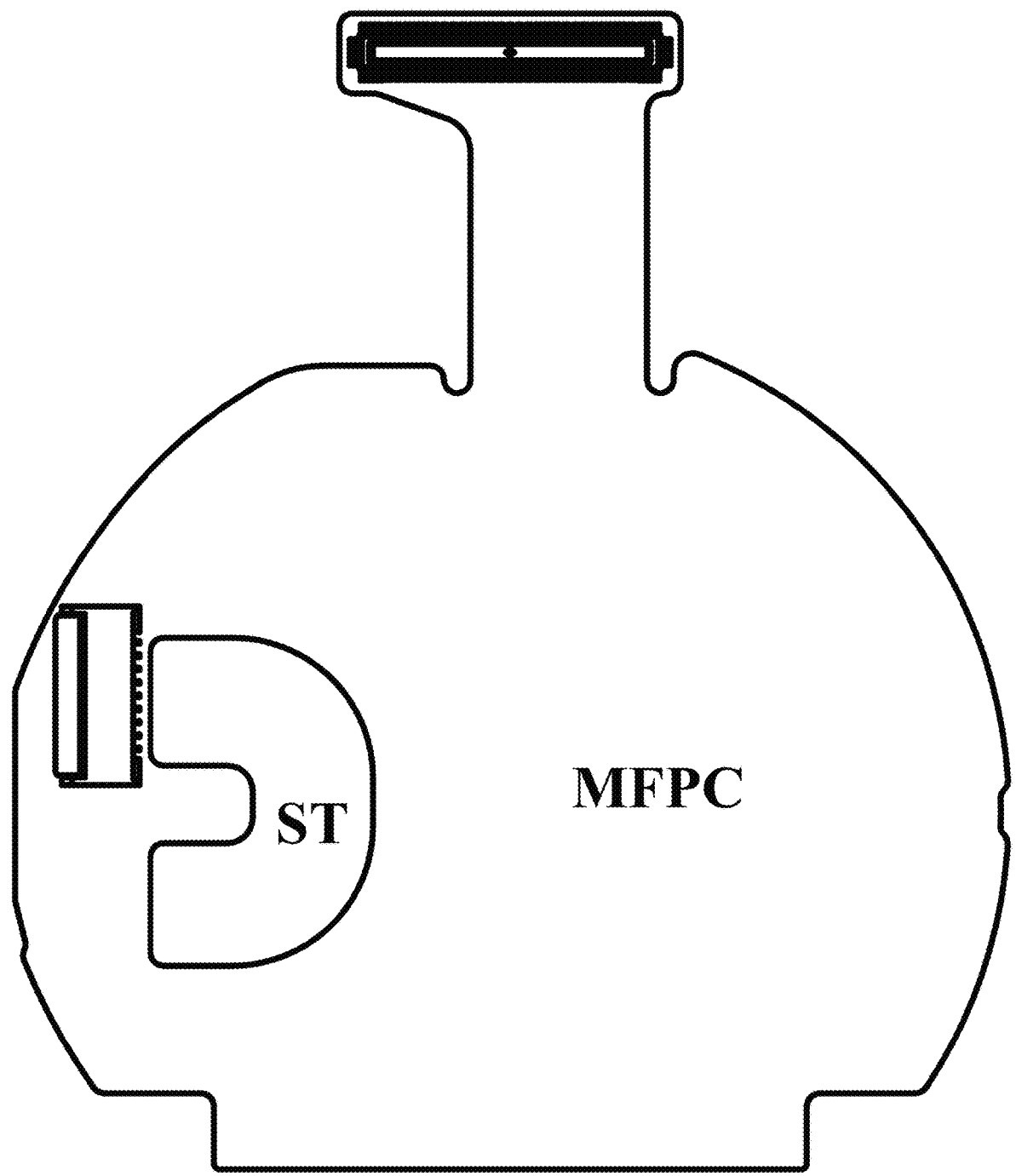
FIG. 4 is a schematic diagram illustrating the structure of a main printed circuit in some embodiments according to the present disclosure.

FIG. 4 is a schematic diagram illustrating the structure of a main printed circuit in some embodiments according to the present disclosure. Referring to FIG. 1 to FIG. 4, the display apparatus in some embodiments includes a slot ST extending through the main printed circuit MFPC, defining a cavity configured to receive at least a first portion of the touch printed circuit TFPC. By embedding the first portion of the touch printed circuit TFPC into the slot ST, the overall thickness of the display apparatus can be reduced. Moreover, the slot ST can be used as an alignment mark reference in the process of plugging in the touch printed circuit TFPC, enhancing the accuracy of bonding the touch printed circuit TFPC to avoid shorts in between bonding pads. Optionally, the cavity is configured to generally conformed to external geometry of the first portion of the touch printed circuit. Optionally, the slot has a substantially U shape. Optionally, the first portion of the touch printed circuit has a substantially U shape. Referring to FIG. 2 and FIG. 4, a thickness of the touch printed circuit TFPC is less than or equal to a depth of the slot ST.

In some embodiments, referring to FIG. 1 to FIG. 2, the display apparatus includes a support layer SL between the main printed circuit MFPC and the display panel DP. The slot ST is configured to expose a surface SF of a portion of the support layer SL. The first portion of the touch printed circuit is secured onto the surface of the portion of the support layer SL.

Figure 5A:
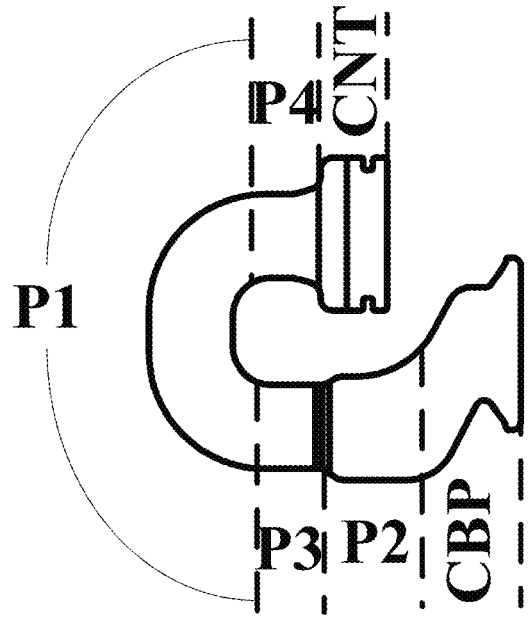
FIG. 5A is a plan view of a touch printed circuit in an unbend state and viewed from a side without adhesive in some embodiments according to the present disclosure.
Figure 5B:
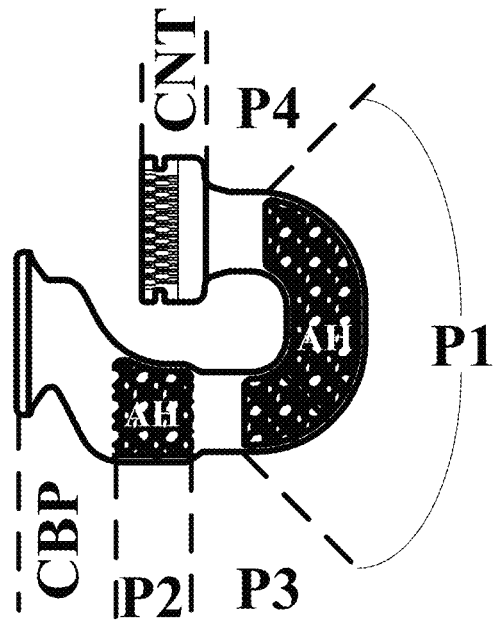
FIG. 5B is a plan view of a touch printed circuit in an unbend state and viewed from a side with adhesive in some embodiments according to the present disclosure.
Figure 5C:
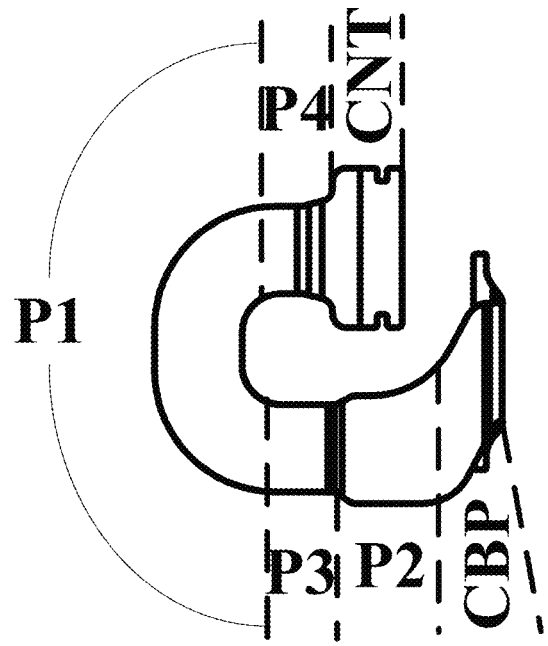
FIG. 5C is a plan view of a touch printed circuit in a bending state and viewed from a side without adhesive in some embodiments according to the present disclosure.
Figure 5D:
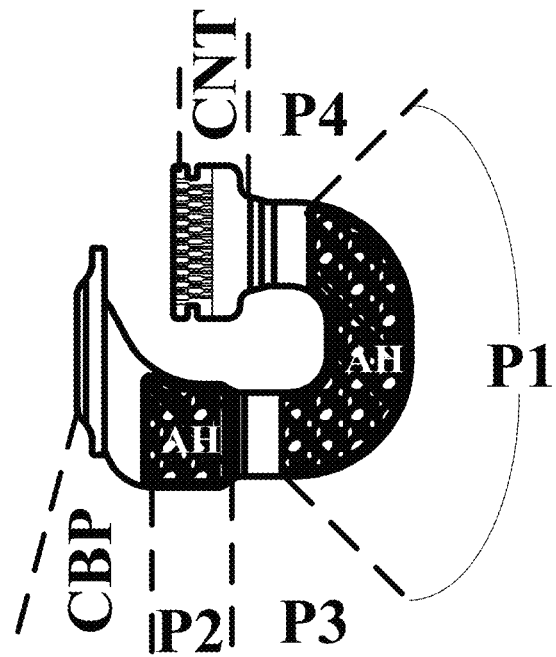
FIG. 5D is a plan view of a touch printed circuit in a bending state and viewed from a side with adhesive in some embodiments according to the present disclosure.

FIG. 5A is a plan view of a touch printed circuit in an unbend state and viewed from a side without adhesive in some embodiments according to the present disclosure. FIG. 5B is a plan view of a touch printed circuit in an unbend state and viewed from a side with adhesive in some embodiments according to the present disclosure. FIG. 5C is a plan view of a touch printed circuit in a bending state and viewed from a side without adhesive in some embodiments according to the present disclosure. FIG. 5D is a plan view of a touch printed circuit in a bending state and viewed from a side with adhesive in some embodiments according to the present disclosure. Referring to FIG. 5A to FIG. 5D, the touch printed circuit in some embodiments includes a first portion P1. Optionally, the first portion P1 is coated with an adhesive AH. Optionally, the first portion P1 of the touch printed circuit is secured onto the surface of the portion of the support layer by adhering to the surface of the portion of the support layer through the adhesive AH.

In some embodiments, the touch printed circuit further includes a second portion P2, and a third portion P3 spacing apart the first portion P1 and the second portion P2. In one example, the first portion P1 and the second portion P2 are respectively coated with an adhesive AH. The third portion P3 is substantially free of the adhesive AH. Referring to FIG. 1, FIG. 2, FIG. 5A to FIG. 5D, the slot ST is configured to expose a surface of a portion of the support layer SL. The first portion P1 of the touch printed circuit TFPC is secured onto the surface SF of the portion of the support layer SL. The second portion P2 of the touch printed circuit TFPC is secured onto a surface of a portion of the main printed circuit MFPC. The third portion P3 of the touch printed circuit TFPC is detached from the support layer SL and detached from the main printed circuit MFPC.

In some embodiments, the touch printed circuit further includes a connect CNT which is configured to be bonded to a portion of the main printed circuit (e.g., to a receiving portion RP as depicted in FIG. 2). The receiving portion RP includes a plurality of first bonding pads, and the connector CNT includes a plurality of second bonding pads. The plurality of first bonding pads are configured to be respectively bonded to the plurality of second bonding pads. Optionally, the touch printed circuit further includes a fourth portion P4 spacing apart the first portion P1 and the connector CNT. The first portion P1 is coated with an adhesive AH, and secured onto a surface of a portion of the main printed circuit. The fourth portion P4 is free of adhesive AH, and is detached from the support layer and detached from the main printed circuit.

Figure 5E:
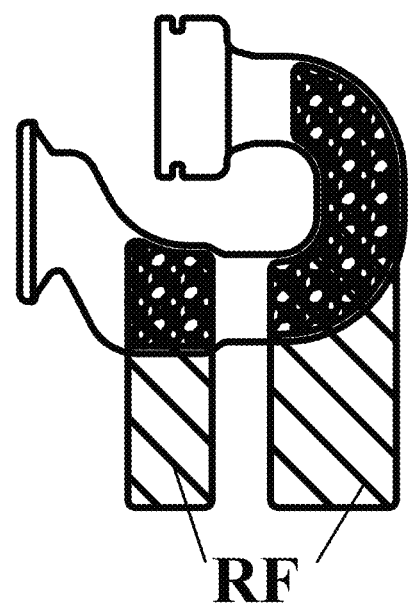
FIG. 5E is a plan view of a touch printed circuit in an unbend state and with a release film attached to the adhesive in some embodiments according to the present disclosure.
Figure 5F:
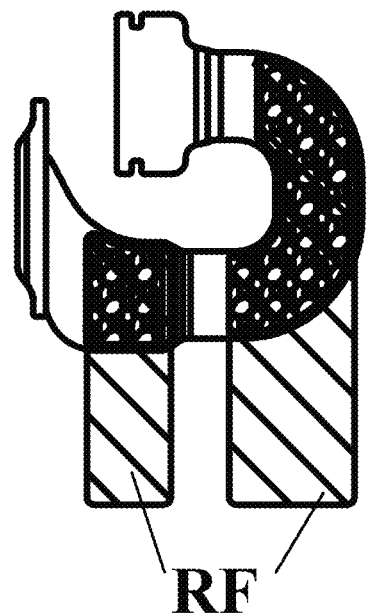
FIG. 5F is a plan view of a touch printed circuit in a bending state and with a release film attached to the adhesive in some embodiments according to the present disclosure.

FIG. 5E is a plan view of a touch printed circuit in an unbend state and with a release film attached to the adhesive in some embodiments according to the present disclosure. FIG. 5F is a plan view of a touch printed circuit in a bending state and with a release film attached to the adhesive in some embodiments according to the present disclosure. Referring to FIG. 5A to FIG. 5F, and FIG. 2, a release film RF protects the adhesive AH before the touch printed circuit TFPC is assembled onto the display apparatus. In the present touch printed circuit, the portions having the adhesive AH are spaced apart by a portion without adhesive. In the process of assembling the touch printed circuit TFPC onto the display apparatus, the release film RF protecting the second portion P2 is first detached from the touch printed circuit, the second portion P2 is then adhered onto a surface of a portion of the main printed circuit MFPC. The connector CNT is then bonded onto the receiving portion RP with the first portion P1 still protected by the release film RF. With the first portion P1 not adhering to the support layer SL at the time of bonding, it provides flexibility and sufficient space for adjusting bonding precision while the slot ST still provides an approximate alignment mark.

Referring to FIG. 1, FIG. 2, FIG. 5A to FIG. 5F, the touch printed circuit TFPC in some embodiments includes a second portion P2 and a circuit bending portion CBP. The circuit bending portion CBP is bent to connect the second portion P2 to the touch control structure TCS, forming a first bending cavity BC1. As depicted in FIG. 2, using the display panel as a reference, the touch control structure TCS is on a light emitting side LES of the display panel DP, on which the display panel DP emits light out of the display apparatus (e.g., out of the cover window CW) for displaying an image. The second portion P2 is on a back side BS of the display panel DP, the back side BS being opposite to the light emitting side LES.

In one example, the second portion P2, the third portion P3, the first portion P1, the fourth portion P4, and the connector CNT are on the back side BS of the display panel DP.

In one example, the circuit bending portion CBP, the second portion P2, the third portion P3, the first portion P1, the fourth portion P4, and the connector CNT are consecutively arranged. The display apparatus further includes a support layer SL between the main printed circuit MFPC and the display panel DP. The slot ST is configured to expose a surface SF of a portion of the support layer SL. The first portion P1 of the touch printed circuit TFPC is secured onto the surface SF of the portion of the support layer SL. The second portion P2 is secured onto a surface of a portion of the main printed circuit MFPC. The third portion P3 is detached from the support layer SL and detached from the main printed circuit MFPC. The fourth portion P4 is detached from the support layer SL and detached from the main printed circuit MFPC. The connector CNT includes a plurality of second bonding pads respectively connected to a plurality of first bonding pads in a bonding area of the main printed circuit MFPC. The circuit bending portion CBP is bent to connect the second portion P2 to the touch control structure TCS, forming a first bending cavity BC1.

Figure 6:
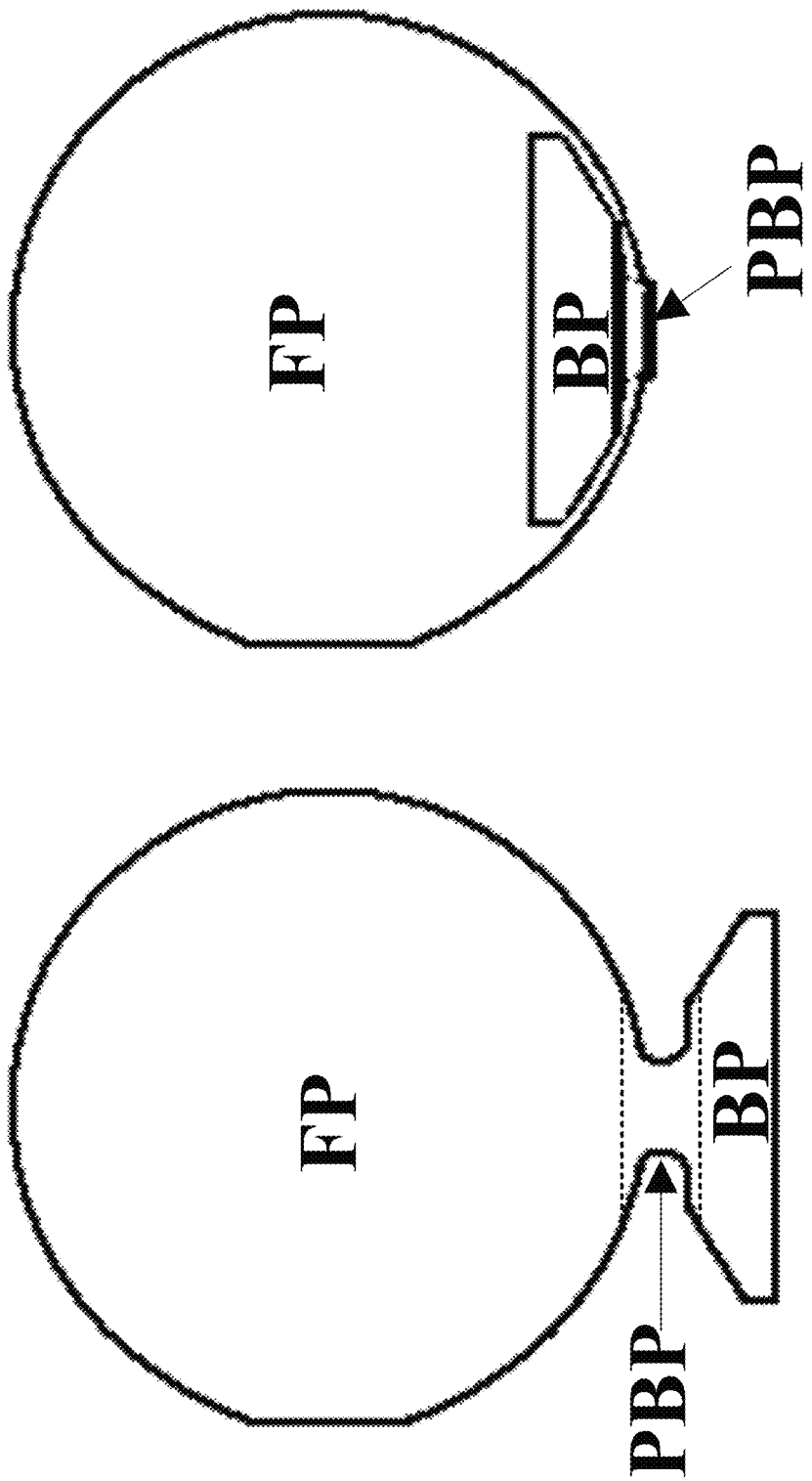
FIG. 6 is a schematic diagram illustrating the structure of a display panel in an unbend state (left) and in a bending state (right) in some embodiments according to the present disclosure.

FIG. 6 is a schematic diagram illustrating the structure of a display panel in an unbend state (left) and in a bending state (right) in some embodiments according to the present disclosure. Referring to FIG. 1, FIG. 3, and FIG. 6, the display panel DP in some embodiments includes a front portion FP configured to display an image, a panel bending portion PBP, and a back portion BP. The front portion FP, the panel bending portion PBP, and the back portion BP are consecutively arranged. Optionally, the panel bending portion PBP is bent to connect the front portion FP to the back portion BP, forming a second bending cavity BC2.

In some embodiments, the display apparatus further includes an integrated circuit IC on a side of the back portion BP away from the support layer SL. Optionally, a portion of the main printed circuit MFPC is on a side of the back portion BP away from the support layer SL.

Referring to FIG. 2 and FIG. 3, in some embodiments, the display apparatus includes a stacked structure. In one example as depicted in FIG. 2 and FIG. 3, the stacked structure includes a main printed circuit MFPC on a back side BS of a display panel DP; a touch printed circuit TFPC bonded to the main printed circuit MFPC; a support layer SL on the main printed circuit MFPC and at least a portion of the touch printed circuit TFPC; at least a portion of the display panel DP on a side of the support layer SL away from the main printed circuit MFPC; a first optical clear adhesive layer OCA1 on a side of the display panel DP away from the support layer SL, the first optical clear adhesive layer OCA1 on a light emitting side LES of the display panel DP; a touch control structure TCS on a side of the first optical clear adhesive layer OCA1 away from the display panel DP; a polarizer POL on a side of the touch control structure TCS away from the first optical clear adhesive layer OCA1; a second optical clear adhesive layer OCA2 on a side of the polarizer POL away from the touch control structure TCS; and a cover window CW on a side of the second optical clear adhesive layer OCA2 away from the polarizer POL. Optionally, the first optical clear adhesive layer OCA1 adheres the touch control structure TCS and a front portion FP of the display panel DP together. Optionally, the second optical clear adhesive layer OCA2 adheres the polarizer POL and the cover window CW together.

In some embodiments, the display panel DP includes a front portion FP configured to display an image. The touch control structure TCS is on a light emitting side LES of the front portion FP. The touch printed circuit TFPC includes a reminder portion on a back side BS of the front portion and a circuit bending portion CBP bent to connect the reminder portion to the touch control structure TCS, the back side BS being opposite to the light emitting side LES. In one example, the reminder portion includes a second portion P2. In another example, the reminder portion includes a second portion P2, the third portion P3, the first portion P1, the fourth portion P4, and the connector CNT. The main printed circuit MFPC and the touch printed circuit TFPC are on the back side BS of the front portion FP. The touch printed circuit TFPC is on a side of the main printed circuit MFPC away from the display panel DP. Optionally, the display apparatus further includes a support layer SL between the main printed circuit MFPC and the front portion FP, and on the back side BS of the front portion FP; and a first optical clear adhesive layer OCA1 between the front portion FP and the touch control structure TCS, adhering the touch control structure TCS onto the front portion FP.

In some embodiments, the display apparatus further includes a polarizer POL on the light emitting side LES of the front portion FP, and on a side of the touch control structure TCS away from the first optical clear adhesive layer OCA1; a second optical clear adhesive layer OCA2 on a side of the polarizer POL away from the touch control structure TCS; and a cover window CW on a side of the second optical clear adhesive layer OCA2 away from the polarizer POL.

In one example, the first bending cavity BC1 is at least partially defined by the circuit bending portion CBP, a peripheral portion of the main printed circuit MFPC, a peripheral portion of the support layer SL, a peripheral portion of the display panel DP, a peripheral portion of the first optical clear adhesive layer OCA1.

In another example, the second bending cavity BC2 is at least partially defined by the panel bending portion PBP and a peripheral portion of the support layer SL.

In some embodiments, the circuit bending portion CBP is configured to bend around a first peripheral portion PP1 of the support layer SL; and the panel bending portion PBP is configured to bend around a second peripheral portion PP2 of the support layer SL. In some embodiments, referring to FIG. 1 to FIG. 3, the first portion PP1 and the second portion PP2 are non-overlapping. The circuit bending portion CBP and the panel bending portion PBP are at different locations of the display apparatus.

Figure 7:
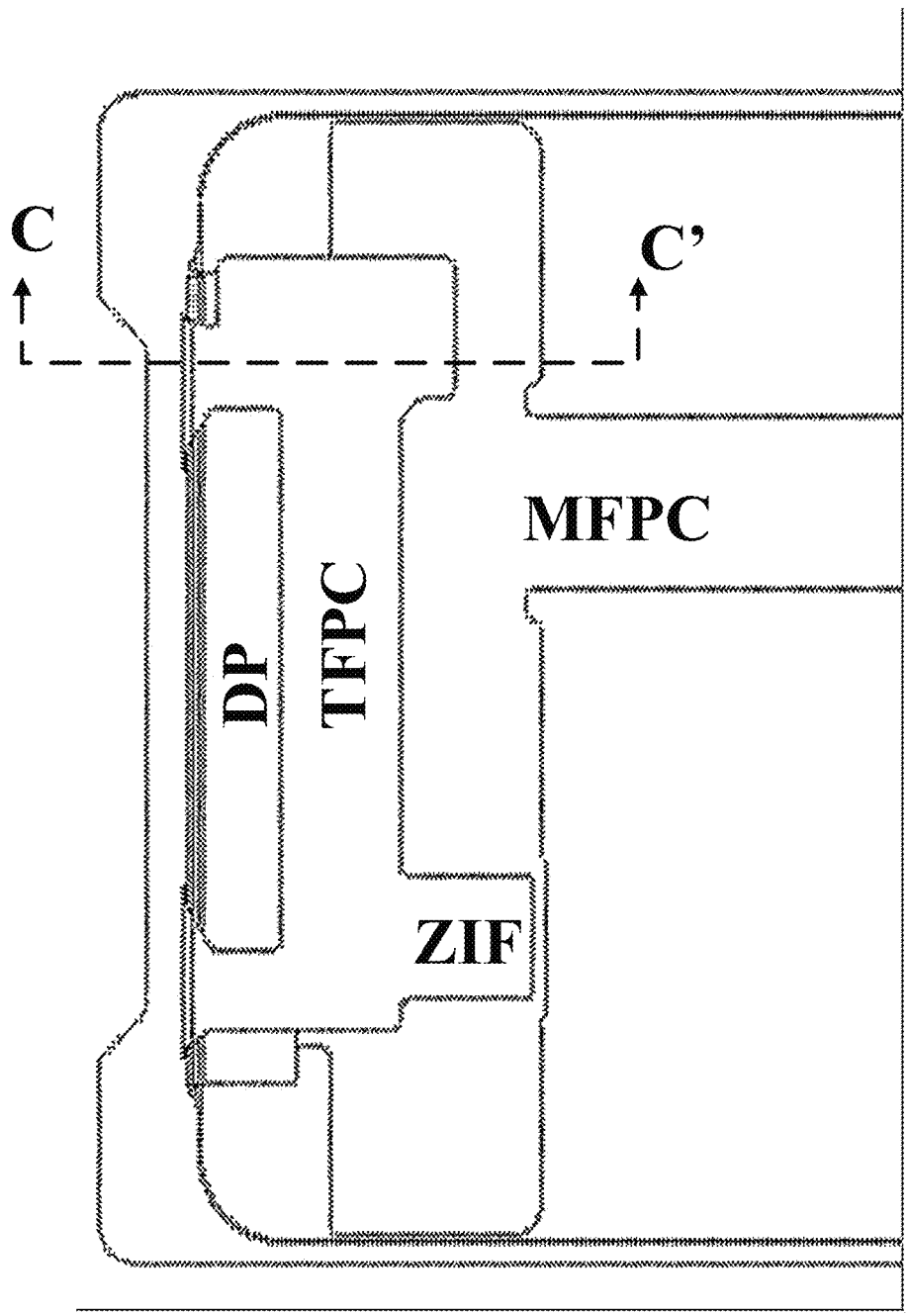
FIG. 7 is a plan view of a back side of a display apparatus in some embodiments according to the present disclosure.
Figure 8:
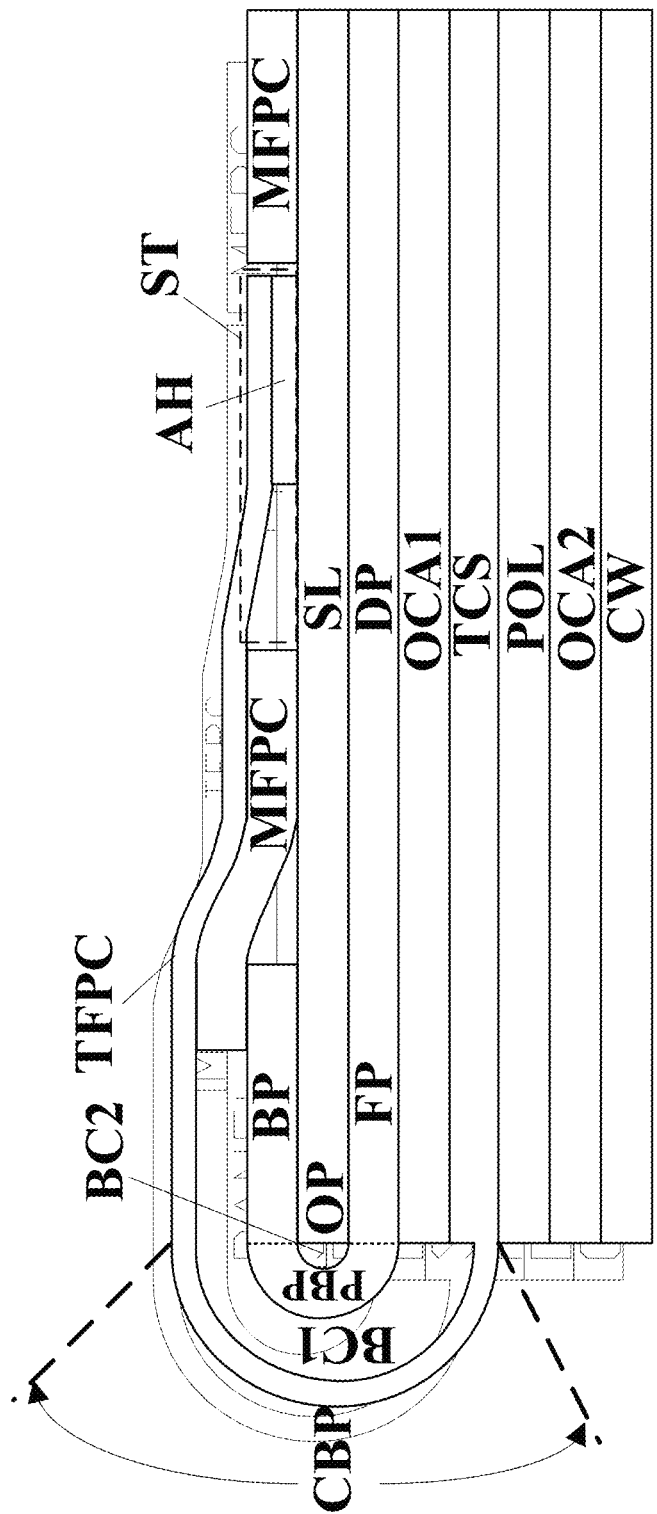
FIG. 8 is a cross-sectional view along a C-C' line in FIG. 7.

In some embodiments, the first portion PP1 and the second portion PP2 are at least partially overlapping. FIG. 7 is a plan view of a back side of a display apparatus in some embodiments according to the present disclosure. FIG. 8 is a cross-sectional view along a C-C' line in FIG. 7. Referring to FIG. 7 and FIG. 8, in some embodiments, the first bending cavity BC1 is at least partially defined by the circuit bending portion CBP, the panel bending portion PBP, a peripheral portion of the main printed circuit MFPC, a peripheral portion of the support layer SL, and a peripheral portion of the first optical clear adhesive layer OCA1. The second bending cavity BC2 is at least partially defined by the panel bending portion PBP and a peripheral portion of the support layer SL. In some embodiments, the circuit bending portion CBP is configured to bend around a first peripheral portion of the support layer SL; and the panel bending portion PBP is configured to bend around a second peripheral portion of the support layer SL. In some embodiments, referring to FIG. 7 and FIG. 8, the first portion and the second portion are at least partially overlapping. At least a portion of the circuit bending portion CBP is configured to bend around an overlapping portion OP of the support layer SL, and at least a portion of the panel bending portion PBP is configured to bend around the overlapping portion OP of the support layer SL.

Figure 9A:
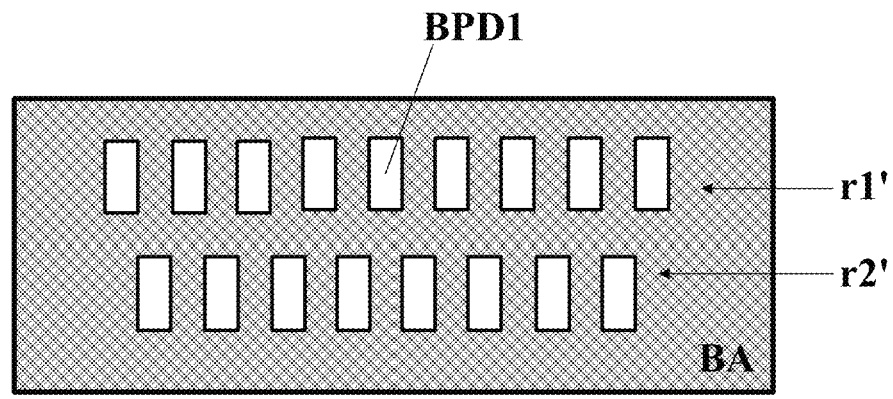
FIG. 9A is a schematic diagram illustrating the structure of a plurality of first bonding pads in a bonding area of a main printed circuit in some embodiments according to the present disclosure.
Figure 9B:
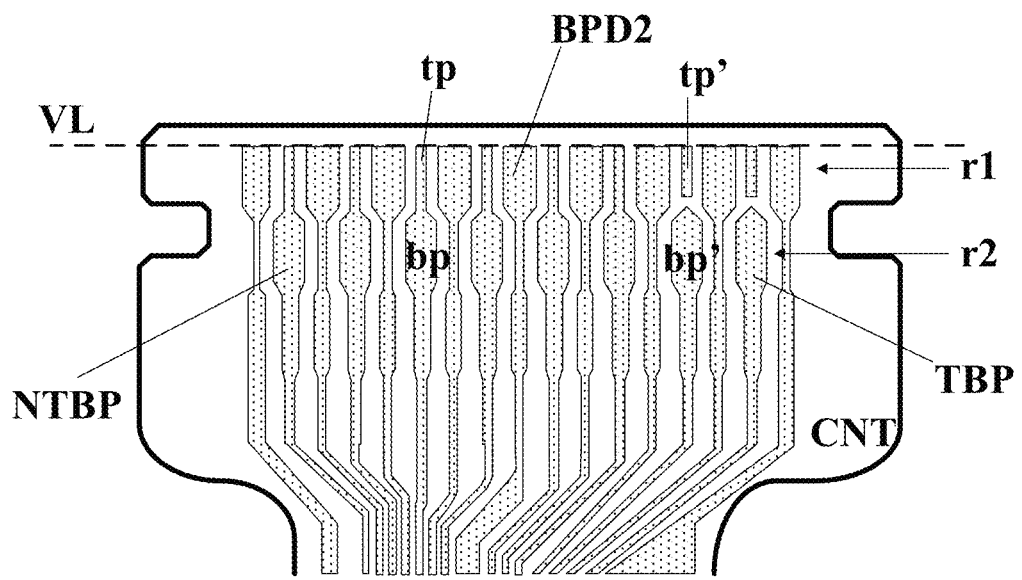
FIG. 9B is a schematic diagram illustrating the structure of a plurality of second bonding pads in a connector of a touch printed circuit in some embodiments according to the present disclosure.
Figure 9C:
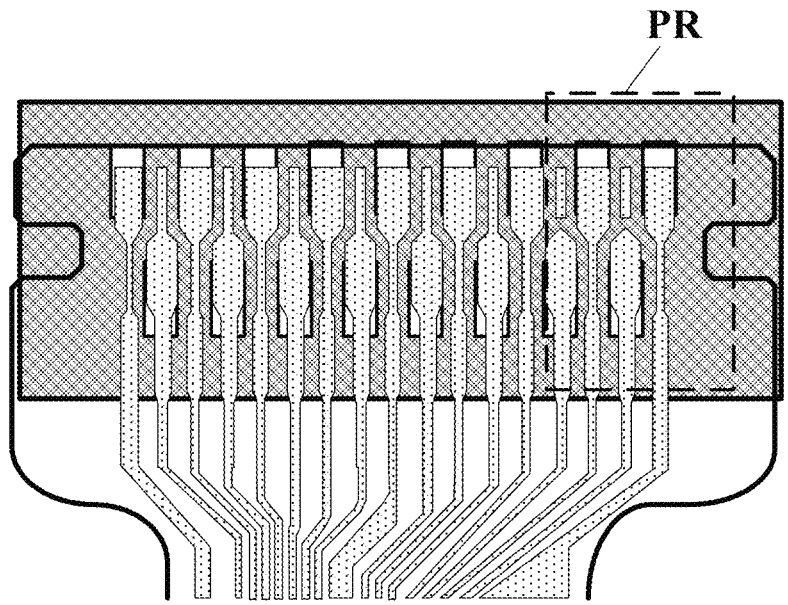
FIG. 9C illustrates a bonding process in which a plurality of first bonding pads are respectively bonded to a plurality of second bonding pads in some embodiments according to the present disclosure.
Figure 9D:
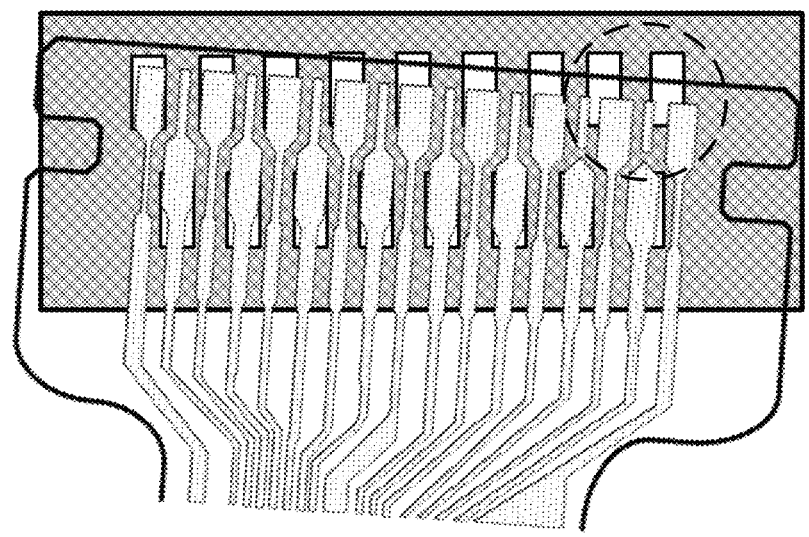
FIG. 9D illustrates a bonding process in which a plurality of first bonding pads are respectively bonded to a plurality of second bonding pads in some embodiments according to the present disclosure.

FIG. 9A is a schematic diagram illustrating the structure of a plurality of first bonding pads in a bonding area of a main printed circuit in some embodiments according to the present disclosure. FIG. 9B is a schematic diagram illustrating the structure of a plurality of second bonding pads in a connector of a touch printed circuit in some embodiments according to the present disclosure. FIG. 9C illustrates a bonding process in which a plurality of first bonding pads are respectively bonded to a plurality of second bonding pads in some embodiments according to the present disclosure. FIG. 9D illustrates a bonding process in which a plurality of first bonding pads are respectively bonded to a plurality of second bonding pads in some embodiments according to the present disclosure. Referring to FIG. 9A to FIG. 9D, in some embodiments, the main printed circuit includes a plurality of first bonding pads BPD1 in a bonding area BA outside a region having the slot. The touch printed circuit includes a connector CNT having a plurality of second bonding pads BPD2 configured to be respectively connected to the plurality of first bonding pads BPD1. The plurality of second bonding pads BPD2 include multiple non-truncated bonding pads NTBP and one or more truncated bonding pads TBP in a same row (e.g., in the second row r2 as depicted in FIG. 9B). A respective truncated bonding pad is truncated at an end as compared to a respective non-truncated bonding pad in the same row. As shown in FIG. 9C, the one or more truncated bonding pads TBP are configured to be bonded to one or more first bonding pads in a peripheral region PR of the bonding area BA.

In one example, the plurality of second bonding pads BPD2 include at least a first row r1 of bonding pads and a second row r2 of bonding pads. Similarly, the plurality of first bonding pads BPD1 include two rows (r1' and r2' as depicted in FIG. 9A) of bonding pads. In another example, the multiple non-truncated bonding pads NTBP and the one or more truncated bonding pads TBP are in the second row r2. In another example, the one or more truncated bonding pads TBP are outermost bonding pads on one side (e.g., the right side as depicted in FIG. 9B) of the second row r2.

In some embodiments, tips of bonding pads in the second row r2 are substantially aligned along a straight virtual line VL. A tip (e.g., "tp" as depicted in FIG. 9B) of the respective non-truncated bonding pad is connected to a pad body (e.g., "bp'" as depicted in FIG. 9B) of the respective non-truncated bonding pad. A tip (e.g., "tp'" as depicted in FIG. 9B) of the respective truncated bonding pad is disconnected from a pad body (e.g., "bp'" as depicted in FIG. 9B) of the respective truncated bonding pad.

In one example, the respective truncated bonding pad and the respective non-truncated bonding pad have a substantially same shape except for disconnection between a tip and a pad body of the respective truncated bonding pad whereas a tip and a pad body of the respective non-truncated bonding pad are connected.

In some embodiments, the respective non-truncated bonding pad includes a first substantially hexagonal pad body (e.g., "bp'" as depicted in FIG. 9B) and a first substantially rectangular tip (e.g., "tp" as depicted in FIG. 9B) connected to the first substantially hexagonal pad body, the first substantially rectangular tip being narrower than the first substantially hexagonal pad body. The respective truncated bonding pad includes a second substantially hexagonal pad body (e.g., "bp'" as depicted in FIG. 9B). The respective truncated bonding pad further includes a second substantially rectangular tip (e.g., "tp'" as depicted in FIG. 9B) disconnected from the substantially hexagonal pad body, the second substantially rectangular tip being narrower than the second substantially hexagonal pad body. As shown in FIG. 9B, a first length of the first substantially rectangular tip along a direction from the first substantially hexagonal pad body to the first substantially rectangular tip is greater than a second length of the second substantially rectangular tip along a direction from the second substantially hexagonal pad body to the second substantially rectangular tip.

In the process of bonding the plurality of second bonding pads to the plurality of first bonding pads, the plurality of second bonding pads may be misaligned with respect to the plurality of first bonding pads. As shown in FIG. 9D, by having one or truncated bonding pads TBP in which tips are disconnected from the pad bodies, short between adjacent pairs of bonding pads can be avoided (the area circled by dotted lines).

Figure 10A:
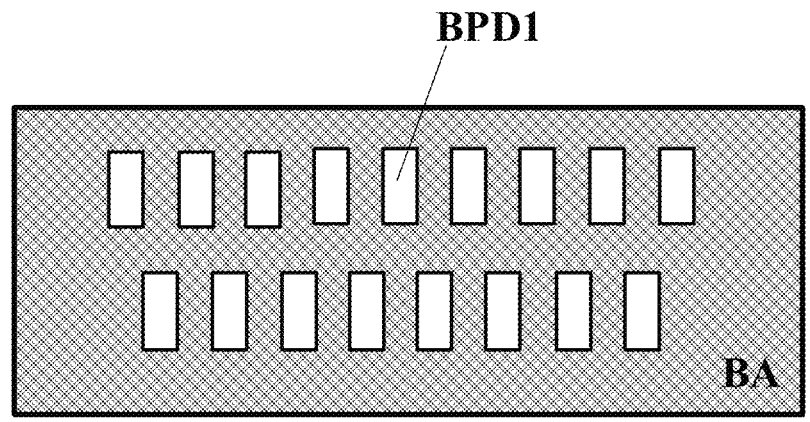
FIG. 10A is a schematic diagram illustrating the structure of a plurality of first bonding pads in a bonding area of a main printed circuit in some embodiments according to the present disclosure.
Figure 10B:
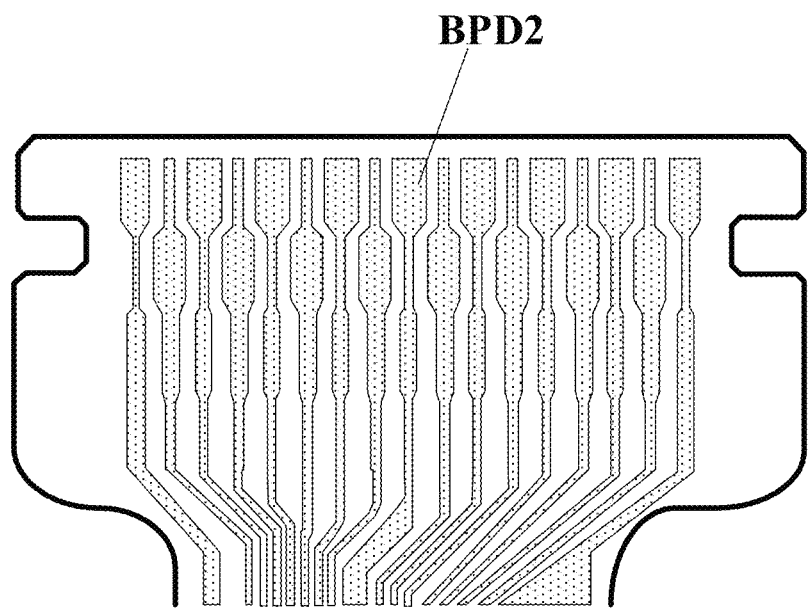
FIG. 10B is a schematic diagram illustrating the structure of a plurality of second bonding pads in a connector of a touch printed circuit in some embodiments according to the present disclosure.
Figure 10C:
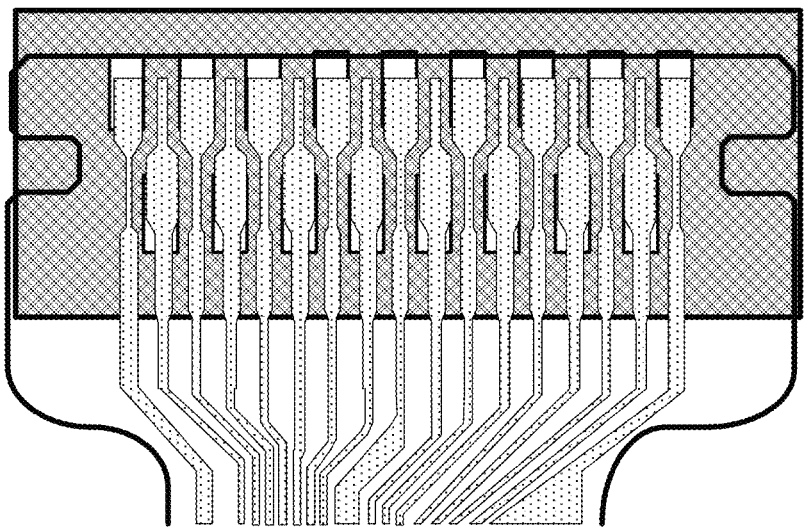
FIG. 10C illustrates a bonding process in which a plurality of first bonding pads are respectively bonded to a plurality of second bonding pads in some embodiments according to the present disclosure.
Figure 10D:
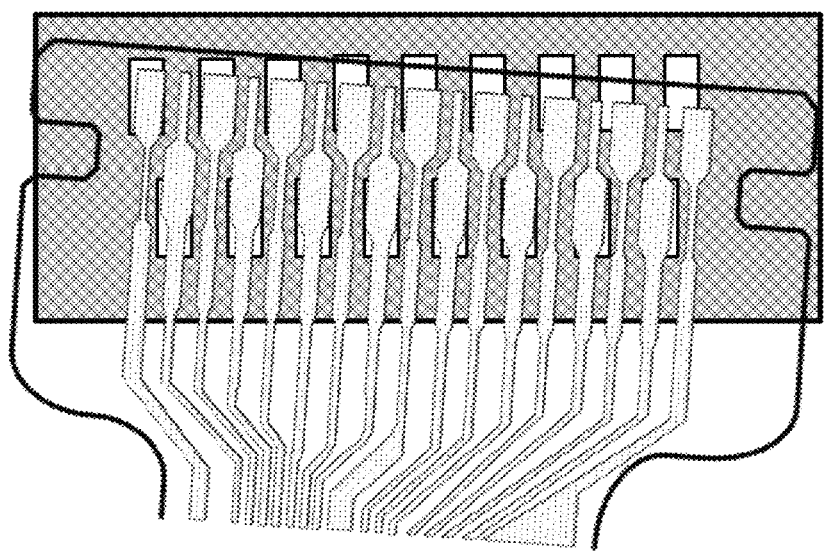
FIG. 10D illustrates a bonding process in which a plurality of first bonding pads are respectively bonded to a plurality of second bonding pads in some embodiments according to the present disclosure.

FIG. 10A is a schematic diagram illustrating the structure of a plurality of first bonding pads in a bonding area of a main printed circuit in some embodiments according to the present disclosure. FIG. 10B is a schematic diagram illustrating the structure of a plurality of second bonding pads in a connector of a touch printed circuit in some embodiments according to the present disclosure. FIG. 10C illustrates a bonding process in which a plurality of first bonding pads are respectively bonded to a plurality of second bonding pads in some embodiments according to the present disclosure. FIG. 10D illustrates a bonding process in which a plurality of first bonding pads are respectively bonded to a plurality of second bonding pads in some embodiments according to the present disclosure. Referring to FIG. 10A to FIG. 10D, the bonding pads do not include truncated bonding pads. As compared to FIG. 9D, when the plurality of second bonding pads may be misaligned with respect to the plurality of first bonding pads, short between adjacent pairs of bonding pads is prone to occur (the area circled by dotted lines).

Various appropriate materials and various appropriate fabricating methods may be used to make the support layer. For example, an organic polymer material may be used to form the support layer. Examples of appropriate organic polymer materials include, but are not limited to, polyethylene terephthalate. In one example, the support layer is a foam layer. In another example, a metallic material may be used to form the support layer. Examples of appropriate metallic materials include, but are not limited to, aluminum, copper, stainless steel, and various appropriate alloys or laminates.

In some embodiments, the support layer includes a heat dissipation material. In one example, the support layer is a heat dissipation plate. Examples of heat dissipation material include super clean foam (SCF), and super clean foam with adhesive effect.

Various appropriate materials and various appropriate fabricating methods may be used to make the first optically clear adhesive layer and the second optically clear adhesive layer. Examples of appropriate optically clear adhesive materials include, but are not limited to, polyacrylic, e.g., polymethyl methacrylate (PMMA); cyclic olefin copolymer; polycarbonate; epoxies; silicone-based, optically clear adhesive materials; or a combination thereof.

Various appropriate materials and various appropriate fabricating methods may be used to make the cover window CW. Examples of appropriate materials for making the cover window CW include, but are not limited to, polyamine such as colorless polyamine, thin glass, ultrathin glass, polyethylene terephthalate, polyacrylate, polymethylmethacrylate, polycarbonate, polyethylene naphthalate, polyvinylidene chloride, polyvinylidene difluoride, polystyrene, an ethylene vinyl alcohol copolymer, and/or a combination thereof. Optionally, the cover window CW has a double-layer structure including a first sub-layer, a second sub-layer, and an adhesive sub-layer adhering the first sub-layer and the second sub-layer together. Optionally, the first sub-layer and the second sub-layer are made of a colorless polyamine, and the adhesive sub-layer is an optically clear adhesive sub-layer. Optionally, the cover window CW further includes a hard coating sub-layer. Optionally, the cover window CW further includes a protective film.

Various appropriate display panels may be used in the present display apparatus. Examples of display panels include an organic light emitting diode display panel, a micro-LED display panel, and a liquid crystal display panel.

Various appropriate touch control structures may be used in the present display apparatus. Examples of touch control structures include a mutual capacitance touch control structure and a self-capacitance touch control structure.

Examples of appropriate display apparatuses include, but are not limited to, an electronic paper, a mobile phone, a tablet computer, a television, a monitor, a notebook computer, a digital album, a GPS, etc.

In another aspect, the present disclosure provides a method of fabricating a display apparatus. In some embodiments, the method includes providing a display panel; electrically connecting a main printed circuit to an array of subpixels in the display panel; providing a touch control structure on the display panel; and electrically connecting a touch printed circuit configured to touch electrodes in the touch control structure. The method in some embodiments further includes forming the main printed circuit, wherein forming the main printed circuit includes forming a slot defining a cavity configured to receive at least a first portion of the touch printed circuit.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A display apparatus, comprising:
   a display panel;
   a main printed circuit configured to be electrically connected to an array of subpixels in the display panel;
   a touch control structure on the display panel; and
   a touch printed circuit configured to be electrically connected to touch electrodes in the touch control structure;
   wherein the display apparatus comprises a slot defining a cavity configured to receive at least a first portion of the touch printed circuit; and
   a thickness of the touch printed circuit is less than or equal to a depth of the slot.

2. The display apparatus of claim 1, further comprising a support layer between the main printed circuit and the display panel;
   wherein the slot is configured to extending through the main printed circuit, exposing a surface of a portion of the support layer; and
   the first portion of the touch printed circuit is secured onto the surface of the portion of the support layer.

3. The display apparatus of claim 1, wherein the main printed circuit comprises a plurality of first bonding pads in a bonding area outside a region having the slot;
   the touch printed circuit comprises a connector comprising a plurality of second bonding pads configured to be respectively connected to the plurality of first bonding pads;
   the plurality of second bonding pads comprise multiple non-truncated bonding pads and one or more truncated bonding pads in a same row; and
   a respective truncated bonding pad is truncated at an end as compared to a respective non-truncated bonding pad in the same row.

4. The display apparatus of claim 3, wherein the one or more truncated bonding pads are configured to be bonded to one or more first bonding pads in a peripheral region of the bonding area.

5. The display apparatus of claim 3, wherein the plurality of second bonding pads comprise at least a first row of bonding pads and a second row of bonding pads;
the multiple non-truncated bonding pads and the one or more truncated bonding pads are in the second row; and
the one or more truncated bonding pads are outermost bonding pads on one side of the second row.

6. The display apparatus of claim 5, wherein tips of bonding pads in the second row are substantially aligned along a straight virtual line;
a tip of the respective non-truncated bonding pad is connected to a pad body of the respective non-truncated bonding pad; and
a tip of the respective truncated bonding pad is disconnected from a pad body of the respective truncated bonding pad.

7. The display apparatus of claim 3, wherein the respective truncated bonding pad and the respective non-truncated bonding pad have a substantially same shape except for disconnection between a tip and a pad body of the respective truncated bonding pad whereas a tip and a pad body of the respective non-truncated bonding pad are connected.

8. The display apparatus of claim 3, wherein the respective non-truncated bonding pad comprises a first substantially hexagonal pad body and a first substantially rectangular tip connected to the first substantially hexagonal pad body, the first substantially rectangular tip being narrower than the first substantially hexagonal pad body; and
the respective truncated bonding pad comprises a second substantially hexagonal pad body.

9. The display apparatus of claim 8, wherein the respective truncated bonding pad further comprises a second substantially rectangular tip disconnected from the second substantially hexagonal pad body, the second substantially rectangular tip being narrower than the second substantially hexagonal pad body; and
a first length of the first substantially rectangular tip along a direction from the first substantially hexagonal pad body to the first substantially rectangular tip is greater than a second length of the second substantially rectangular tip along a direction from the second substantially hexagonal pad body to the second substantially rectangular tip.

10. The display apparatus of claim 1, wherein the touch printed circuit comprises the first portion, a second portion, and a third portion spacing apart the first portion and the second portion;
the first portion and the second portion are respectively coated with an adhesive; and
the third portion is substantially free of the adhesive.

11. The display apparatus of claim 10, further comprising a support layer between the main printed circuit and the display panel;
wherein the slot is configured to expose a surface of a portion of the support layer;
the first portion of the touch printed circuit is secured onto the surface of the portion of the support layer;
the second portion of the touch printed circuit is secured onto a surface of a portion of the main printed circuit; and
the third portion of the touch printed circuit is detached from the support layer and detached from the main printed circuit.

12. The display apparatus of claim 1, wherein the touch printed circuit comprises:
a connector comprising a plurality of second bonding pads; and
a fourth portion spacing apart the first portion and the connector;
wherein the first portion is coated with an adhesive, and secured onto a surface of a portion of the main printed circuit;
the plurality of second bonding pads of the connector are respectively connected to a plurality of first bonding pads in a bonding area of the main printed circuit; and
the fourth portion is detached from the support layer and detached from the main printed circuit.

13. The display apparatus of claim 1, wherein the touch printed circuit comprises a second portion and a circuit bending portion;
the circuit bending portion is bent to connect the second portion to the touch control structure, forming a first bending cavity;
the touch control structure is on a light emitting side of the display panel; and
the second portion is on a back side of the display panel, the back side being opposite to the light emitting side.

14. The display apparatus of claim 1, wherein the touch printed circuit comprises a circuit bending portion, a second portion, a third portion, the first portion, a fourth portion, and a connector consecutively arranged;
the display apparatus further comprises a support layer between the main printed circuit and the display panel;
the slot is configured to expose a surface of a portion of the support layer;
the first portion of the touch printed circuit is secured onto the surface of the portion of the support layer;
the second portion is secured onto a surface of a portion of the main printed circuit;
the third portion is detached from the support layer and detached from the main printed circuit;
the fourth portion is detached from the support layer and detached from the main printed circuit;
the connector comprising a plurality of second bonding pads respectively connected to a plurality of first bonding pads in a bonding area of the main printed circuit; and
the circuit bending portion is bent to connect the second portion to the touch control structure, forming a first bending cavity.

15. The display apparatus of claim 1, wherein the display panel comprises a front portion configured to display an image, a panel bending portion, and a back portion consecutively arranged; and
the panel bending portion is bent to connect the front portion to the back portion, forming a second bending cavity.

16. The display apparatus of claim 15, further comprising a support layer between the main printed circuit and the display panel;
wherein the touch printed circuit comprises a second portion and a circuit bending portion;
the circuit bending portion is bent to connect the second portion to the touch control structure, forming a first bending cavity;
the circuit bending portion is configured to bend around a first portion of a periphery of the support layer; and
the panel bending portion is configured to bend around a second portion of the periphery of the support layer.

17. The display apparatus of claim 16, wherein the first portion and the second portion are non-overlapping.

18. The display apparatus of claim 16, wherein the first portion and the second portion are at least partially overlapping.

19. The display apparatus of claim 1, wherein the display panel comprises a front portion configured to display an image;
- the touch control structure is on a light emitting side of the front portion;
- the touch printed circuit comprises a reminder portion on a back side of the front portion and a circuit bending portion bent to connect the reminder portion to the touch control structure, the back side being opposite to the light emitting side; and
- the main printed circuit and the touch printed circuit are on the back side of the front portion, the touch printed circuit being on a side of the main printed circuit away from the display panel;
- wherein the display apparatus further comprises:
- a support layer between the main printed circuit and the front portion, and on the back side of the front portion; and
- a first optical clear adhesive layer between the front portion and the touch control structure, adhering the touch control structure onto the front portion.

20. The display apparatus of claim 1, wherein the cavity is configured to generally conformed to external geometry of the first portion of the touch printed circuit.

* * * * *